(12) United States Patent
Hino

(10) Patent No.: US 7,935,945 B2
(45) Date of Patent: May 3, 2011

(54) ION IMPLANTATION METHOD AND APPARATUS

(75) Inventor: Masayoshi Hino, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 282 days.

(21) Appl. No.: 12/369,290

(22) Filed: Feb. 11, 2009

(65) Prior Publication Data

US 2009/0200491 A1    Aug. 13, 2009

(30) Foreign Application Priority Data

Feb. 12, 2008    (JP) ................. 2008-030749

(51) Int. Cl.
*A61N 5/00* (2006.01)
*G21G 5/00* (2006.01)
(52) U.S. Cl. ............... 250/492.3; 250/492.1; 250/492.2; 250/492.22; 250/492.21; 250/397; 250/398; 438/7; 438/525; 438/522; 438/535; 430/30
(58) Field of Classification Search ............... 250/492.3, 250/492.1, 492.2, 492.22, 492.21, 397, 398; 438/7, 525, 522, 535; 430/30
See application file for complete search history.

(56) References Cited

U.S. PATENT DOCUMENTS

| | | | |
|---|---|---|---|
| 2004/0058513 A1* | 3/2004 | Murrell et al. | 438/535 |
| 2005/0184254 A1* | 8/2005 | Matsumoto et al. | 250/492.21 |
| 2009/0200492 A1* | 8/2009 | Hino | 250/492.3 |

FOREIGN PATENT DOCUMENTS

| | | |
|---|---|---|
| JP | 3-114128 | 5/1991 |
| JP | 2004-95434 | 3/2004 |
| JP | 3692999 | 7/2005 |

OTHER PUBLICATIONS

Patent Abstracts of Japan for Japanese Publication No. 2003-132835, Publication date May 9, 2003 (1 page) (Corresponds to JP3692999).
Patent Abstracts of Japan for Japanese Publication No. 03-114128, Publication date May 15, 1991 (1 page).
Patent Abstracts of Japan for Japanese Publication No. 2004-095434, Publication date Mar. 25, 2004 (1 page).

* cited by examiner

*Primary Examiner* — Bernard E Souw
*Assistant Examiner* — Meenakshi S Sahu
(74) *Attorney, Agent, or Firm* — Osha Liang LLP

(57) ABSTRACT

Using a beam current of an ion beam, and a dose amount to a substrate, and an initial value of a scan number of the substrate set to 1, a scan speed of the substrate is calculated. If the scan speed is within the range, the current scan number and the current scan speed are set as a practical scan number and a practical scan speed, respectively. If the scan speed is higher than the upper limit of the range, the calculation process is aborted. If the scan speed is lower than the lower limit of the range, the scan number is incremented by one to calculate a corrected scan number. A corrected scan speed is calculated by using the corrected scan number, etc. The above steps are repeated until the corrected scan speed is within the allowable scan speed range.

12 Claims, 12 Drawing Sheets

ION IMPLANTATION METHOD AND APPARATUS

TECHNICAL FIELD

The present disclosure relates to an ion implantation method and apparatus for implanting ions into a substrate using both a ribbon-like (this is called also a sheet-like or a strip-like) ion beam in which, with or without performing an X-direction sweep, a dimension in an X direction is larger than a dimension in a Y direction that is orthogonal to the X direction, and a mechanical scan of the substrate in a direction intersecting with the principal face of the ion beam. In the specification, in order to be easily distinguished from a sweep of an ion beam, an operation of mechanically sweeping a substrate is referred to as a scan.

RELATED ART

FIG. 9 shows a related-art example of an ion implantation apparatus of this kind. The ion implantation apparatus has a configuration which implants ions into (for example, a whole face of) a substrate (for example, a semiconductor substrate) 2 using both a ribbon-like ion beam 4 and an operation of mechanically scanning the substrate 2 in a direction intersecting with the principal face 4b (see FIG. 11) of the ion beam 4, by a substrate driving device 10.

Referring to FIG. 11, for example, the ion beam 4 undergoes a sweep process in the X direction (for example, a horizontal direction) which is based on an electric or magnetic field produced by a beam sweeper (not shown), and has a ribbon-like section shape in which the dimension in the X direction is larger than that in the Y direction (for example, a vertical direction) that is orthogonal to the X direction. For example, the ion beam 4 before the sweep operation has a section shape such as a small oval or circle as indicated by the reference numeral 4a in FIG. 11. Alternatively, without undergoing such sweep a process in the X direction, the ion beam 4 (for example, the ion beam itself derived from an ion source) may have a ribbon-like section shape in which the dimension in the X direction is larger than that in the Y direction.

In this example, the substrate driving device 10 has: a holder 12 which holds the substrate 2; a motor 14 which rotates the holder 12 together with the substrate 2 about a center portion 2a of the substrate 2 as indicated by the arrow A (or in the opposite direction) (this motor is referred to as the twist motor in order to be distinguished from a motor 16 which will be described later); and the motor 16 which drives (reciprocally swings) the holder 12 together with the substrate 2 and the twist motor 14 as indicated by the arrow B to change the inclination angle θ of the holder 12 and the substrate 2 (this motor is referred to as the tilt motor in order to be distinguished from the twist motor 14). For example, the inclination angle θ can be changed in a range from 0 deg. (i.e., the state where the holder 12 is vertical) to the vertical to 90 deg. (i.e., the state where the holder 12 is horizontal).

The substrate driving device 10 further has a scanning device 18 which mechanically scans the holder 12, the substrate 2, and the like so as to reciprocate between one end (for example, the lower end) 20 of the scan and the other end (for example, the upper end) 22 as indicated by the arrow C, thereby mechanically scanning the substrate 2 in a direction (for example, the Y direction) intersecting with the principal face 4b of the ion beam 4. The scan direction of the substrate 2 is not restricted to the direction of the arrow C (the Y direction). In some cases, the scan may be performed in parallel with the surface of the substrate 2. In the specification, one scan of the substrate 2 means a one-way scan.

A substrate driving device having a configuration which is substantially identical with that of the substrate driving device 10 is disclosed in Patent Reference 1.

As shown in FIG. 10, for example, replacement of the substrate 2 with respect to the holder 12 (for example, that of an ion-implanted substrate 2 with a substrate 2 before the ion implantation) is performed while the holder 12 is set to a substantially horizontal state at the one end 20 of the scan.

In the ion implantation into the substrate 2, in accordance with Expression 1 or an expression which is mathematically equivalent thereto, for example, the scan number of the substrate 2 is calculated by using the beam current of the ion beam 4, the dose amount to the substrate 2, and a reference scan speed which is used as a reference for calculating the scan number of the substrate 2. Usually, the calculated scan number is a mixed decimal with number of digits after the decimal point. Therefore, a scan number in which the digits after the decimal point are truncated, or which is an integer is calculated, and the calculated number is set as a scan number which is practically used. In the case where the calculated scan number is 3.472, for example, 3 is set as the scan number which is practically used. In accordance with Expression 2 or an expression which is mathematically equivalent thereto, for example, the scan speed which is practically used is calculated by the scan number which is practically used. In related-art, the ion implantation is performed on the substrate 2 in accordance with the scan number and scan speed which are calculated in this manner.

$$\text{scan number [time]} = \frac{\text{dose amount [ions/cm}^2\text{]} \times \text{reference scan speed [cm/sec]} \times \text{elementary electric charge [C]} \times \text{coefficient}}{\text{beam current} \times 10^{-6}\text{[C/sec]}} \quad \text{[Expression 1]}$$

$$\text{scan speed [cm/sec]} = \frac{\text{beam current} \times 10^{-6}\text{[C/sec]} \times \text{scan number}}{\text{dose amount [ions/cm}^2\text{]} \times \text{elementary electric charge [C]} \times \text{coefficient}} \quad \text{[Expression 2]}$$

In Expressions 1 and 2 described above, the elementary electric charge is $1.602 \times 10^{-19}$ [C], and the coefficient is a coefficient which is specific to the ion implantation apparatus. This is applicable also to Expression 4 which will be described later.

FIG. 12 shows an example of the scan number and scan speed of the substrate 2 in the case where the related-art ion implantation method (apparatus) is employed. FIG. 12 is a graph showing transitions of the scan number and the scan speed in the case where the dose amount is fixed and the beam current is reduced. The reference scan speed was 320 mm/sec. In order to make the dose amount constant, the scan number is increased in accordance with reduction of the beam current. In the case where the beam current is largely reduced, the scan number is largely increased. Also in the case where the beam current is fixed and the dose amount is increased, a similar tendency is obtained.

[Patent Reference 1] JP-A-2004-95434 (Paragraphs [0010] to [0017], FIG. 6)

In the vicinities of the ends of the scan of the substrate 2, the substrate must be decelerated and accelerated in order to perform the scan return operation, and a time loss is caused by the deceleration and the acceleration. This will be described in detail with reference to FIG. 13. This time loss is a total of wasted times other than the time of implantation into the substrate 2 (this time occurs twice per scan) during the time for one scan. Most of the time loss consists of the deceleration time before the scan return and the acceleration time after the scan return. The time loss is the sum of these deceleration and acceleration times and an overscan time (this time also occurs twice per scan) for the overscan of the substrate 2 (the operation in which the substrate 2 is overscanned in slightly excess so that the substrate 2 is surely located outside the ion beam 4). For example, the time loss is about 0.4 sec. per scan in the case where the reference scan speed is 320 mm/sec., and about 0.5 sec. per scan in the case where the reference scan speed is 200 mm/sec.

In the specification, the term "scan speed" means the scan speed in the implantation time and the overscan time.

When the scan number is increased, also the number of decelerations and accelerations of the substrate in the vicinities of the scan ends is increased, with the result that many time losses are accumulated, and the throughput is reduced.

SUMMARY

Exemplary embodiments of the present invention provide an ion implantation method and apparatus in which accumulation of time losses which mainly consist of deceleration and acceleration times in the vicinities of scan ends is suppressed, so that the throughput is improved.

An ion implantation method according to a first aspect of the invention is characterized in that the method includes: a scan speed calculating step of setting an initial value of a scan number of the substrate to 1, and calculating a scan speed of the substrate by using a beam current of the ion beam, a dose amount to the substrate and the initial value of a scan number of the substrate;

a scan speed determining step of: determining whether the scan speed of the substrate is within a predetermined allowable scan speed range or not; if the scan speed is within the allowable scan speed range, setting the current scan number and the current scan speed as a practical scan number and a practical scan speed, respectively; if the scan speed is higher than an upper limit of the allowable scan speed range, aborting a process of obtaining the practical scan number and the practical scan speed; and, if the scan speed is lower than a lower limit of the allowable scan speed range, incrementing the scan number by one to calculate a corrected scan number;

a corrected-scan speed calculating step of, when the corrected scan number is calculated, calculating a corrected scan speed by using the corrected scan number, the beam current, and the dose amount;

a repeating step of, when the corrected scan speed is calculated, performing a process of the scan speed determining step on the corrected scan speed, and repeating the scan speed determining step and the corrected-scan speed calculating step until the corrected scan speed is within the allowable scan speed range; and an ion implanting step of implanting ions into the substrate in accordance with the practical scan number and the practical scan speed.

An ion implantation apparatus according to a second aspect of the invention is characterized in that the apparatus comprises a controlling device having a function of performing: (a) a scan speed calculating process of setting an initial value of a scan number of the substrate to 1, and calculating a scan speed of the substrate by using a beam current of the ion beam, and a dose amount to the substrate, and the initial value of a scan number of the substrate; (b) a scan speed determining process of: determining whether the scan speed of the substrate is within a predetermined allowable scan speed range or not; if the scan speed is within the allowable scan speed range, setting the current scan number and the current scan speed as a practical scan number and a practical scan speed, respectively; if the scan speed is higher than an upper limit of the allowable scan speed range, aborting a process of obtaining the practical scan number and the practical scan speed; and, if the scan speed is lower than a lower limit of the allowable scan speed range, incrementing the scan number by one to calculate a corrected scan number; (c) a corrected-scan speed calculating process of, when the corrected scan number is calculated, calculating a corrected scan speed by using the corrected scan number, the beam current, and the dose amount; (d) a repeating process of, when the corrected scan speed is calculated, performing a process of the scan speed determining step on the corrected scan speed, and repeating the scan speed determining step and the corrected-scan speed calculating step until the corrected scan speed is within the allowable scan speed range; and (e) an ion implanting process of implanting ions into the substrate in accordance with the practical scan number and the practical scan speed.

In the ion implantation method or apparatus, under conditions that the scan speed of the substrate is within the predetermined allowable scan speed range, ion implantation can be performed in a scan number which is as small as possible. Therefore, accumulation of time losses which mainly consist of deceleration and acceleration times of the substrate in the vicinities of scan ends can be suppressed.

In an ion implantation method and apparatus according to a third aspect of the invention, the scan speed determining step may include a scan number determining step of, if the scan speed is within the allowable scan speed range, determining whether the current scan number is even or odd; if the current scan number is even, setting the current scan number and the current scan speed as the practical scan number and the practical scan speed, respectively; and, if the current scan number is odd, incrementing the scan number by one to calculate a corrected scan number, and the repeating step may repeat the scan speed determining step and the corrected-scan speed calculating step until the corrected scan speed is within the allowable scan speed range and the corrected scan number becomes even.

In an ion implantation method and apparatus according to a fourth aspect of the invention, the function of performing (b) the scan speed determining process may include a scan number determining process of, if the scan speed is within the allowable scan speed range, determining whether the current scan number is even or odd; if the current scan number is even, setting the current scan number and the current scan speed as the practical scan number and the practical scan speed, respectively; and, if the current scan number is odd, incrementing the scan number by one to calculate a corrected scan number, and the function of performing (d) the repeating process may repeat the scan speed determining step and the corrected-scan speed calculating step until the corrected scan speed is within the allowable scan speed range and the corrected scan number becomes even.

In an ion implantation method and apparatus according to fifth and sixth aspects of the invention, in the scan speed calculating step or the scan speed calculating process, the initial value of the scan number of the substrate may be set to 2 in place of 1.

In an ion implantation method and apparatus according to seventh and eighth aspects of the invention, in the scan speed calculating step or the scan speed calculating process, the initial value of the scan number of the substrate may be set to 2 in place of 1, and, in the scan speed determining step or the scan speed determining process, the scan number may be incremented by 2 in place of one to calculate the corrected scan number.

An ion implantation method according to a ninth aspect of the invention is a method of implanting ions into a substrate using both a ribbon-like ion beam in which, with or without performing an X direction sweep, a dimension in an X direction is larger than a dimension in a Y direction that is orthogonal to the X direction, a mechanical scan of the substrate in a direction intersecting with a principal face of the ion beam, and performance of ion implantation while, during a period when the ion beam does not impinge on the substrate, rotating the substrate by a step of 360/m deg. about a center portion of the substrate, and dividing one rotation of the substrate into a plurality m of implanting steps, the method comprising:

a scan speed calculating step of setting an initial value of a scan number of the substrate per implanting step to 1, and calculating a scan speed of the substrate by using a beam current of the ion beam, a dose amount to the substrate, a implanting step number, and the initial value of the scan number of the substrate, and;

a scan speed determining step of: determining whether the scan speed of the substrate is within a predetermined allowable scan speed range or not; if the scan speed is within the allowable scan speed range, setting the current scan number per implanting step, and the current scan speed as a practical scan number per implanting step, and a practical scan speed, respectively; if the scan speed is higher than an upper limit of the allowable scan speed range, aborting a process of obtaining the practical scan number per implanting step, and the practical scan speed; and, if the scan speed is lower than a lower limit of the allowable scan speed range, incrementing the scan number per implanting step by one to calculate a corrected scan number per implanting step;

a corrected-scan speed calculating step of, when the corrected scan number per implanting step is calculated, calculating a corrected scan speed, by using the corrected scan number per implanting step, the beam current, the dose amount, and the implanting step number;

a repeating step of, when the corrected scan speed is calculated, performing a process of the scan speed determining step on the corrected scan speed, and repeating the scan speed determining step and the corrected-scan speed calculating step until the corrected scan speed is within the allowable scan speed range; and an ion implanting step of implanting ions into the substrate in accordance with the practical scan number per implanting step and the practical scan speed.

An ion implantation apparatus according to a tenth aspect of the invention is an apparatus for implanting ions into a substrate using both a ribbon-like ion beam in which, with or without performing an X direction sweep, a dimension in an X direction is larger than a dimension in a Y direction that is orthogonal to the X direction, a mechanical scan of the substrate in a direction intersecting with a principal face of the ion beam, and performance of ion implantation while, during a period when the ion beam does not impinge on the substrate, rotating the substrate by a step of 360/m deg. about a center portion of the substrate, and dividing one rotation of the substrate into a plurality m of implanting steps, the apparatus comprising:

a controlling device having a function of performing: (a) a scan speed calculating process of setting an initial value of a scan number of the substrate per implanting step to 1, and calculating a scan speed of the substrate by using a beam current of the ion beam, a dose amount to the substrate, a implanting step number and the initial value of the scan number of the substrate per implanting step; (b) a scan speed determining process of: determining whether the scan speed of the substrate is within a predetermined allowable scan speed range or not; if the scan speed is within the allowable scan speed range, setting the current scan number per implanting step, and the current scan speed as a practical scan number per implanting step, and a practical scan speed, respectively; if the scan speed is higher than an upper limit of the allowable scan speed range, aborting a process of obtaining the practical scan number per implanting step, and the practical scan speed; and, if the scan speed is lower than a lower limit of the allowable scan speed range, incrementing the scan number per implanting step by one to calculate a corrected scan number per implanting step; (c) a corrected-scan speed calculating process of, when the corrected scan number per implanting step is calculated, calculating a corrected scan speed, by using the corrected scan number per implanting step, the beam current, the dose amount, and the implanting step number; (d) a repeating process of, when the corrected scan speed is calculated, performing a process of the scan speed determining step on the corrected scan speed, and repeating the scan speed determining step and the corrected-scan speed calculating step until the corrected scan speed is within the allowable scan speed range; and (e) an ion implanting process of implanting ions into the substrate in accordance with the practical scan number per implanting step and the practical scan speed.

In the ion implantation method or apparatus, under conditions that the scan speed of the substrate is within the predetermined allowable scan speed range, ion implantation can be performed in a scan number per implanting step which is as small as possible. Therefore, accumulation of time losses which mainly consist of deceleration and acceleration times of the substrate in the vicinities of scan ends can be suppressed.

In an ion implantation method and apparatus according to an eleventh and twelfth aspect of the invention, the implanting step number may be even-numbered.

According to the inventions set forth in the first, second, fifth and sixth aspects, under conditions that the scan speed of the substrate is within the predetermined allowable scan speed range, ion implantation can be performed in a scan number which is as small as possible. Therefore, accumulation of time losses which mainly consist of deceleration and acceleration times in the vicinities of scan ends can be suppressed, and the throughput can be improved.

According to the inventions set forth in the third, fourth, seventh and eighth aspects, under conditions that the scan speed of the substrate is within the predetermined allowable scan speed range, ion implantation can be performed in a scan number which is as small as possible. Therefore, accumulation of time losses which mainly consist of deceleration and acceleration times of the substrate in the vicinities of scan ends can be suppressed, and the throughput can be improved.

Moreover, the practical scan number of the substrate can be surely even-numbered. As a result, a time loss due to the moving time for one extra scan in the case where the scan number is odd can be eliminated. Also from this viewpoint, therefore, the throughput can be improved.

According to the inventions set forth in the ninth and tenth aspects, under conditions that the scan speed of the substrate is within the predetermined allowable scan speed range, ion implantation can be performed in a scan number per implanting step which is as small as possible. Therefore, accumulation of time losses which mainly consist of deceleration and acceleration times of the substrate in the vicinities of scan ends can be suppressed, and the throughput can be improved.

According to the inventions set forth in the eleventh and twelfth aspects, the implanting step number is even, and hence the total scan number can be surely even-numbered irrespective of whether the scan number per implanting step is odd or even. As a result, a time loss due to the moving time of one extra scan in the case where the total scan number is odd can be eliminated. Also from this viewpoint, therefore, the throughput can be improved.

Other features and advantages may be apparent from the following detailed description, the accompanying drawings and the claims.

DETAILED DESCRIPTION

Figure 1:
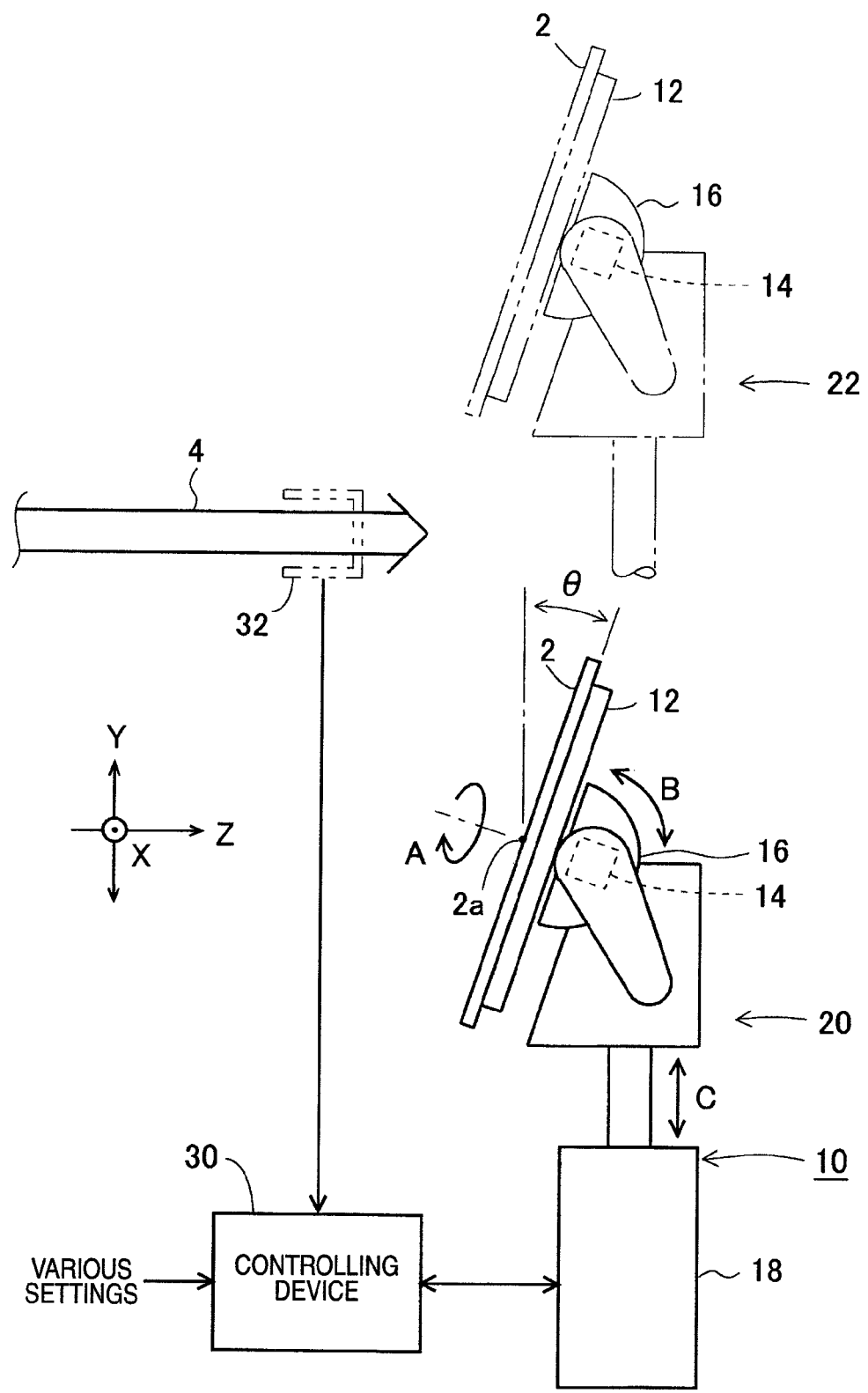
FIG. 1 is a side view showing an embodiment of an ion implantation apparatus for implementing the ion implantation method of the invention.
Figure 9:
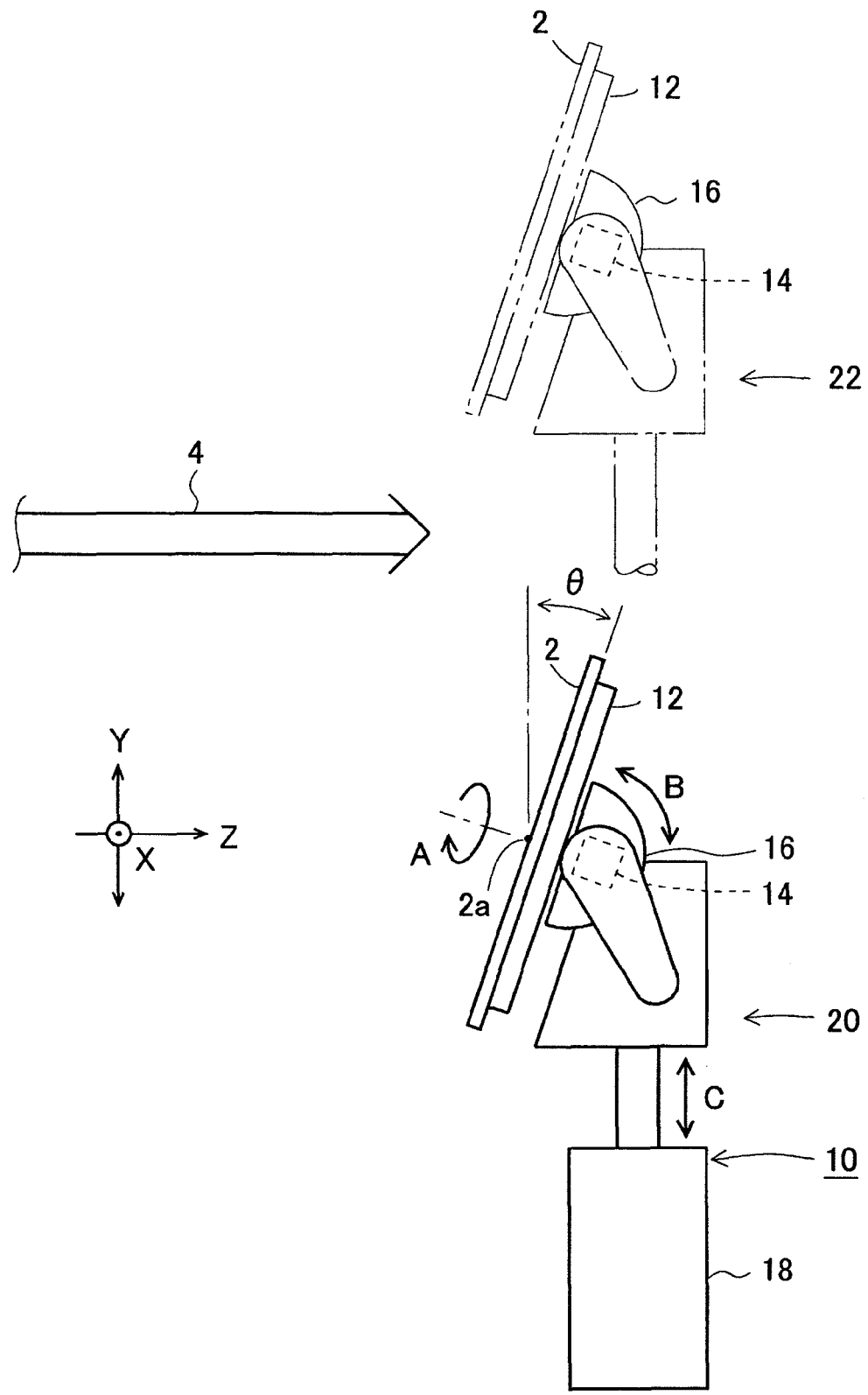
FIG. 9 is a side view showing an example of an ion implantation apparatus for implementing a related-art ion implantation method.
Figure 10:
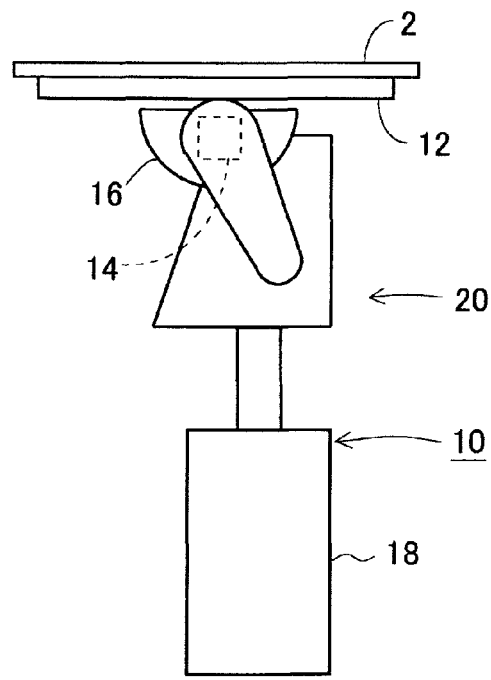
FIG. 10 is a view showing an example of a state of a substrate driving device in replacement of a substrate.
Figure 11:
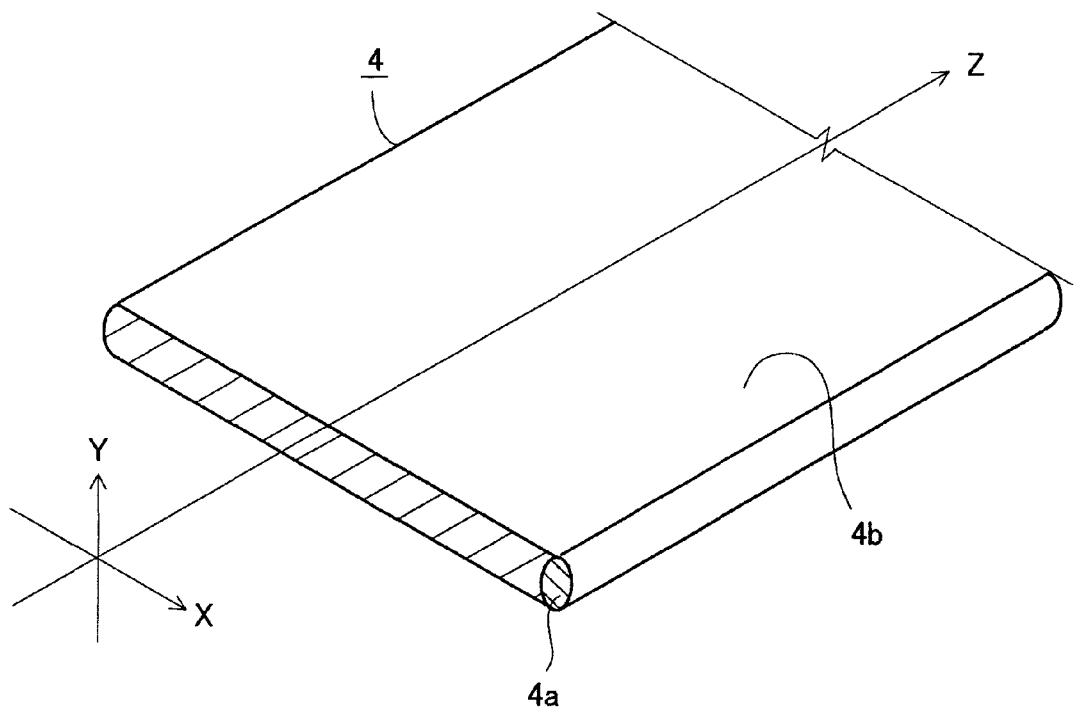
FIG. 11 is a perspective view partly showing an example of a ribbon-like ion beam.

FIG. 1 is a side view showing an embodiment of an ion implantation apparatus for implementing the ion implantation method of the invention. The portions which are identical or corresponding to those of the related-art example shown in FIGS. 9 to 11 are denoted by the same reference numerals, and, in the following description, emphasis is placed on differences from the related-art example.

The ion implantation apparatus includes, in addition to the configuration of the above-described related-art ion implantation apparatus, a controlling device 30 having a function of performing a calculation control which will be described later, and a beam current measuring device 32 which measures the beam current of the ion beam 4.

The beam current of the ion beam 4, and the dose amount of the substrate 2 are given to the controlling device 30. In the embodiment, more specifically, a measurement value which is measured by the beam current measuring device 32 is given as the beam current of the ion beam 4. The dose amount is given as a preset value.

The beam current measuring device 32 is, for example, a Faraday cup, and receives the ion beam 4 which is conducting the ion implantation into the substrate 2, at a position where the device does not interfere with the ion implantation into the substrate 2 (for example, in the vicinity of one end in the X direction of the ribbon-like ion beam 4), and measures the beam current of the ion beam.

The controlling device 30 has a function of controlling the substrate driving device 10, specifically, the scanning device 18, twist motor 14, and tilt motor 16 which constitute the substrate driving device. More specifically, the controlling device 30 performs the calculation control which will be described below, to implement an ion implantation method which will be described below. An example will be described with reference to FIG. 2.

As described above, the beam current of the ion beam 4, and the dose amount of the substrate 2 are given to the controlling device 30 (step 100). Furthermore, 1 is given as an initial value of the scan number (for example, 1 is set, step 101). In accordance with Expression 2 described above or an expression which is mathematically equivalent thereto, for example, the speed of the scan of the substrate 2 which is performed for realizing the dose amount by the substrate driving device 10 (more specifically, the scanning device 18) is calculated by using these values (step 102). The steps 100 to 102 constitute a scan speed calculating step.

Next, it is determined whether the scan speed of the substrate 2, more specifically, the above-calculated scan speed or a corrected scan speed which will be described later is within a predetermined allowable scan speed range or not (step 103). For example, the allowable scan speed range is a speed range which can be realized by the scanning device 18, such as a range from 100 mm/sec. to 320 mm/sec.

If the scan speed is within the allowable scan speed range, the current scan number and the current scan speed are set as a practical scan number (namely, which is to be practically used, the same shall apply hereinafter) and a practical scan speed, respectively (step 104). If the scan speed is higher than the upper limit of the allowable scan speed range, the process of obtaining the practical scan number and the practical scan speed is aborted (step 105), because, even when the scan number is later increased, only a situation where the scan speed is increased is produced, and therefore the scan speed cannot be caused to be within the allowable scan speed range. In this case, for example, the implantation conditions (the beam current and the dose amount) are changed, and the process is are again performed with starting from step 100. If the scan speed is lower than the lower limit of the allowable scan speed range, the scan number is incremented by 1 to calculate the corrected scan number (step 106). The steps 103 to 106 constitute a scan speed determining step.

In the case where the corrected scan number is calculated, in accordance with Expression 2 described above or an expression which is mathematically equivalent thereto, for example, the corrected scan speed of the substrate 2 for realizing the dose amount is calculated by using the corrected scan number, the beam current, and the dose amount (step 107). This step is a corrected-scan speed calculating step.

In the case where the corrected scan speed is calculated, then, the process returns to step 103, and the scan speed determining step is performed on the corrected scan speed to repeat the scan speed determining step and the corrected-scan speed calculating step until the corrected scan speed is within the allowable scan speed range. This step is a repeating step. Therefore, the scan number is incremented by a step of 1 from the initial value of 1.

As a result, the practical scan number and the practical scan speed are obtained (step 104), and hence ion implantation is performed on the substrate 2 in accordance with the practical scan number and the practical scan speed (step 108). This step is an ion implanting step.

Preferably, the beam current of the ion beam 4 is not a preset value but a value measured by the beam current measuring device 32 as in the embodiment. According to the configuration, even when the beam current fluctuates during ion implantation into the single substrate 2, a control of changing the scan speed in direct proportion to the beam current can be performed, so that uniform ion implantation in the Y direction can be realized without being affected by the fluctuation of the beam current. The control in which the scan speed is in direct proportion to the beam current as described above is disclosed also in, for example, JP-A-3-114128 (see the upper left column of page 2) and Japanese Patent No. 3,692,999 (see Paragraph [0037]).

In the ion implantation in step 108, there are two cases: (a) the ion implantation into the single substrate 2 is always performed at the scan speed; and (b) the ion implantation is performed with using also a control in which, while using the practical scan speed as a reference, the scan speed is in direct proportion to the beam current as described above during ion implantation into the single substrate 2. The term "in accordance with the practical scan speed" in step 108 described above is used in the meaning that both the cases (a) and (b) are included. This is applicable also to ion implantation (steps 108, 118) in other embodiments which will be described later.

In the embodiment, the controlling device 30 has a function of performing: a scan speed calculating process which is identical in content to the scan speed calculating step; a scan speed determining process which is identical in content to the scan speed determining step; a corrected-scan speed calculating process which is identical in content to the corrected-scan speed calculating step; a repeating process which is identical in content to the repeating step; and an ion implanting process which is identical in content to the ion implanting step. The controlling device has a further function of performing a control in which the scan speed is in direct proportion to the beam current as described above during ion implantation into the substrate 2.

In the ion implantation method (apparatus) of the embodiment, under conditions that the scan speed of the substrate 2 is within the predetermined allowable scan speed range, ion implantation can be performed in a scan number which is as small as possible. Therefore, accumulation of time losses (for example, about 0.4 to 0.5 sec. per scan) which mainly consist of deceleration and acceleration times of the substrate 2 in the vicinities of scan ends can be suppressed, and the throughput can be improved.

When the scan number is reduced, the scan speed is lowered in order to realize the same dose amount (see Expression 2), but the implantation time of the substrate 2 is not changed. From this point of view, the throughput is not reduced. This will be described by way of an example. It is assumed that an implantation time which is required for implanting a desired dose amount at a certain beam current is, for example, 6 sec. Even when implantation is performed in six split implantation times of 1 sec., or in three split implantation times of 2 sec., the total implantation time is 6 sec. or unchanged.

Examples of results of the measurement of the throughput will be briefly described. When the scan number was reduced from nine to three, the throughput was improved by about 7%, and, when the scan number was reduced from seven to three, the throughput was improved by about 5%.

Next, another embodiment will be described with reference to FIGS. 3 to 5 and 8. The portions which are identical or corresponding to those of FIG. 2 are denoted by the same reference numerals, and, in the following description, emphasis is placed on differences from FIG. 2.

Figure 2:
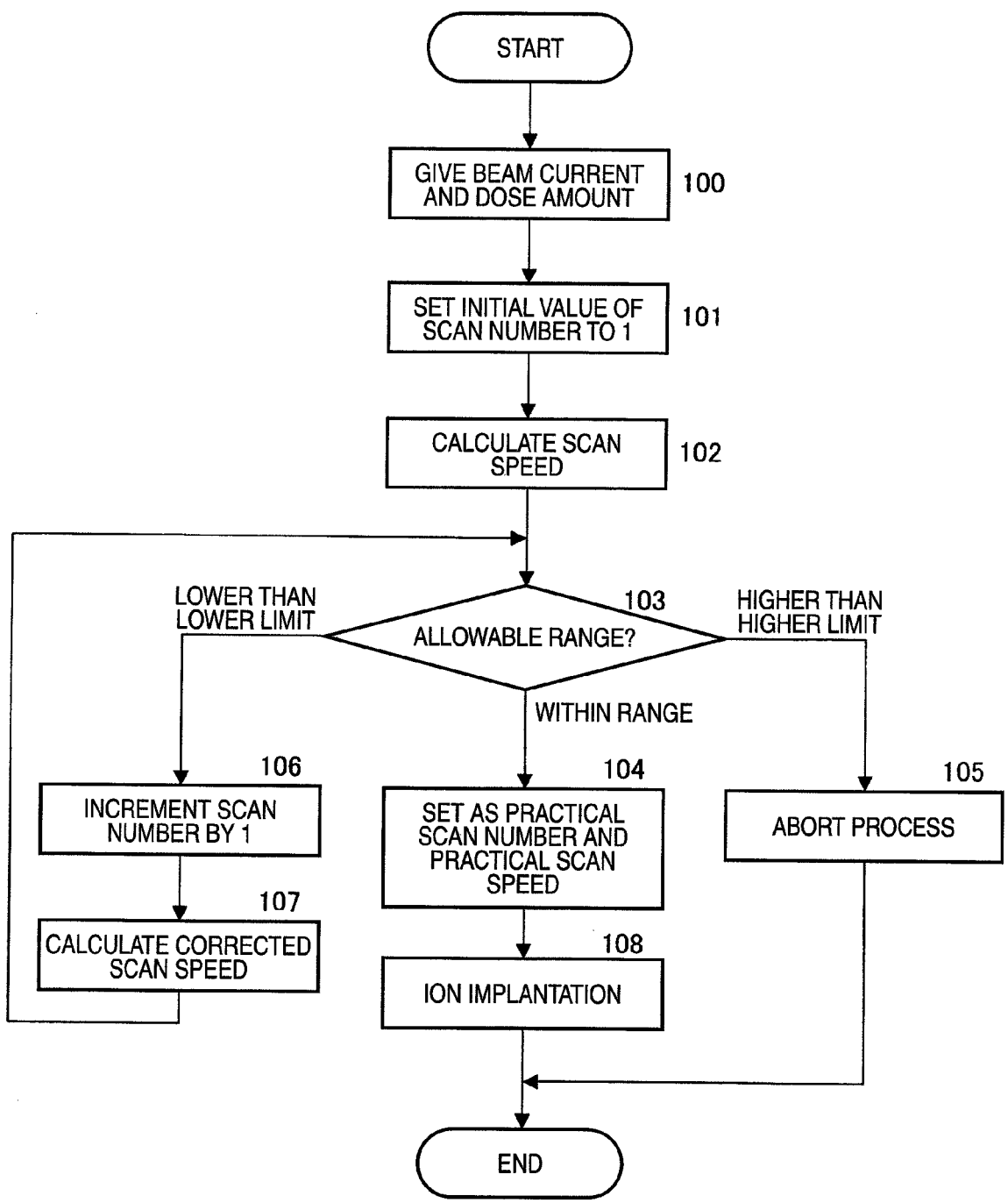
FIG. 2 is a flowchart showing an embodiment of the ion implantation method of the invention.
Figure 3:
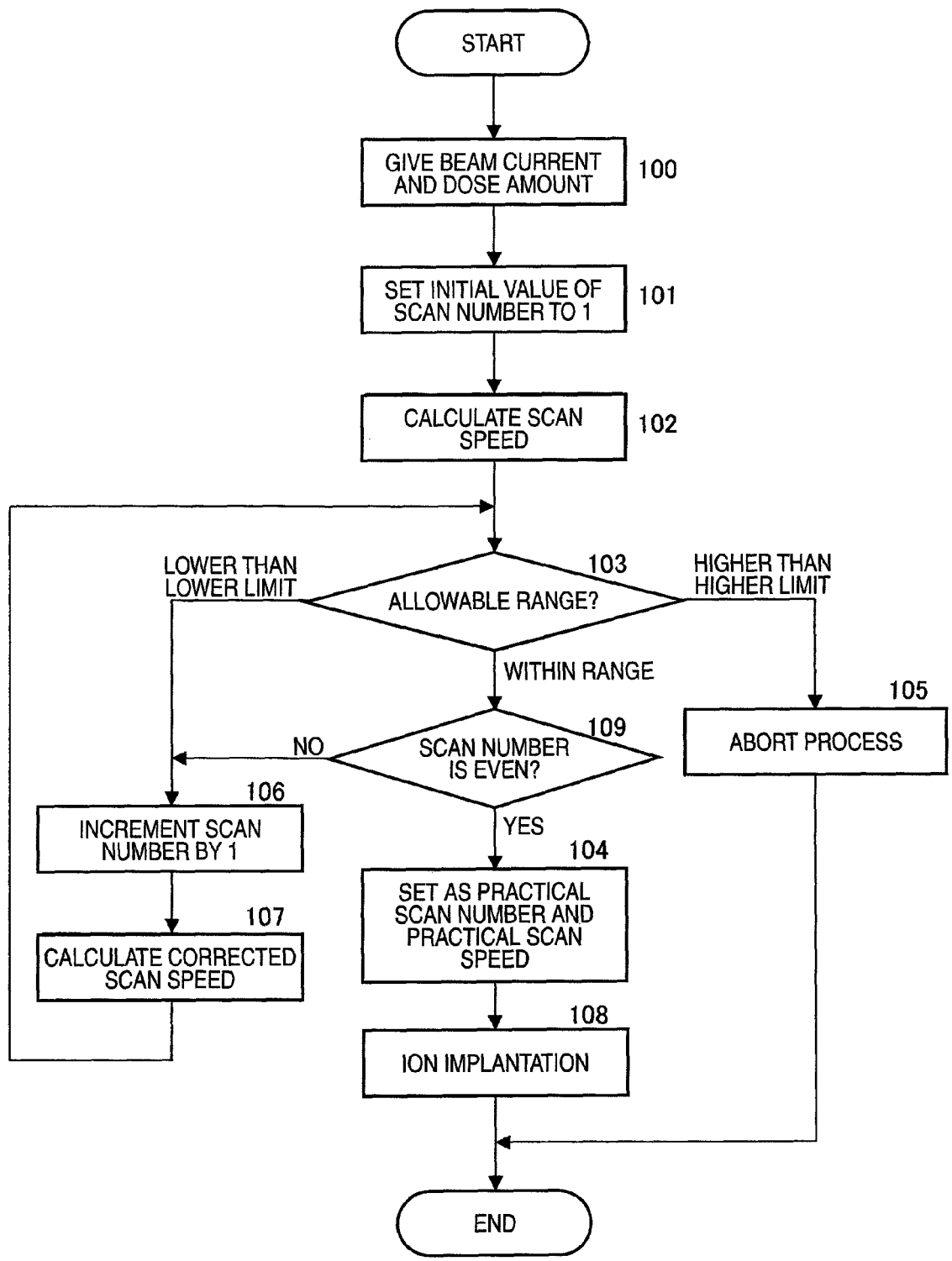
FIG. 3 is a flowchart showing another embodiment of the ion implantation method of the invention.

In the embodiment shown in FIG. 3, step 109 is added to the flowchart of FIG. 2. If it is determined in step 103 described above that the scan speed of the substrate 2 is within the predetermined allowable scan speed range, it is determined whether the scan number is even or odd (step 109). If the scan number is even, the control proceeds to step 104 described above, and the scan number and the scan speed are set as the practical scan number and the practical scan speed, respectively. If the scan number is odd, the control proceeds to step 106 described above, and the scan number is incremented by 1 to calculate the corrected scan number.

In the embodiment shown in FIG. 3, in place of the above-described scan speed determining step, there is a scan speed determining step including a scan number determining step, which is configured by steps 103 to 106 and 109 described above.

In the embodiment shown in FIG. 3, the controlling device 30 has a function of performing a scan speed determining step including a scan number determining step which is identical in content to the scan speed determining step including the scan number determining step, in place of the scan speed determining process.

In the ion implantation method (apparatus) of the embodiment shown in FIG. 3, similarly with the embodiment shown in FIG. 2, under conditions that the scan speed of the substrate 2 is within the predetermined allowable scan speed range, ion implantation can be performed in a scan number which is as small as possible. Therefore, accumulation of time losses which mainly consist of deceleration and acceleration times of the substrate 2 in the vicinities of scan ends can be suppressed, and the throughput can be improved.

Moreover, the practical scan number of the substrate 2 can be surely even-numbered. As a result, a time loss due to the moving time of one extra scan in the case where the scan number is odd can be eliminated. Also from this viewpoint, the throughput can be improved.

Effects due to the configuration where the practical scan number is even-numbered will be described in more detail.

In the case where the scan number of the substrate 2 is odd, as indicated by the dash-dot-dot line in FIG. 1, the substrate 2, the holder 12, and the like at the end of the ion implantation into the substrate 2 are located in the other end 22 of the scan. As described above, the position of replacement of the substrate 2 with respect to the holder 12 is in the end 20 of the scan (see also FIG. 10). After the ion implantation, therefore, the substrate 2, the holder 12, and the like must be moved (in this example, lowered) by a distance corresponding to one scan. The moving time for the one scan is extra and becomes a time loss. For example, the time loss per substrate is about 1 to 1.6 sec. The time loss causes the throughput of the ion implantation to be lowered.

By contrast, in the case where the practical scan number is surely even-numbered, the time loss due to the moving time for the one scan can be eliminated, and therefore the throughput can be improved.

Results of measurements of the throughput in the case where both the reduction of the scan number and the even numbering are used as in the embodiment shown in FIG. 3 will be briefly exemplified. When the scan number was reduced from nine to four, the throughput was improved by about 10%, and, when the scan number was reduced from seven to four, the throughput was improved by about 10%.

Figure 4:
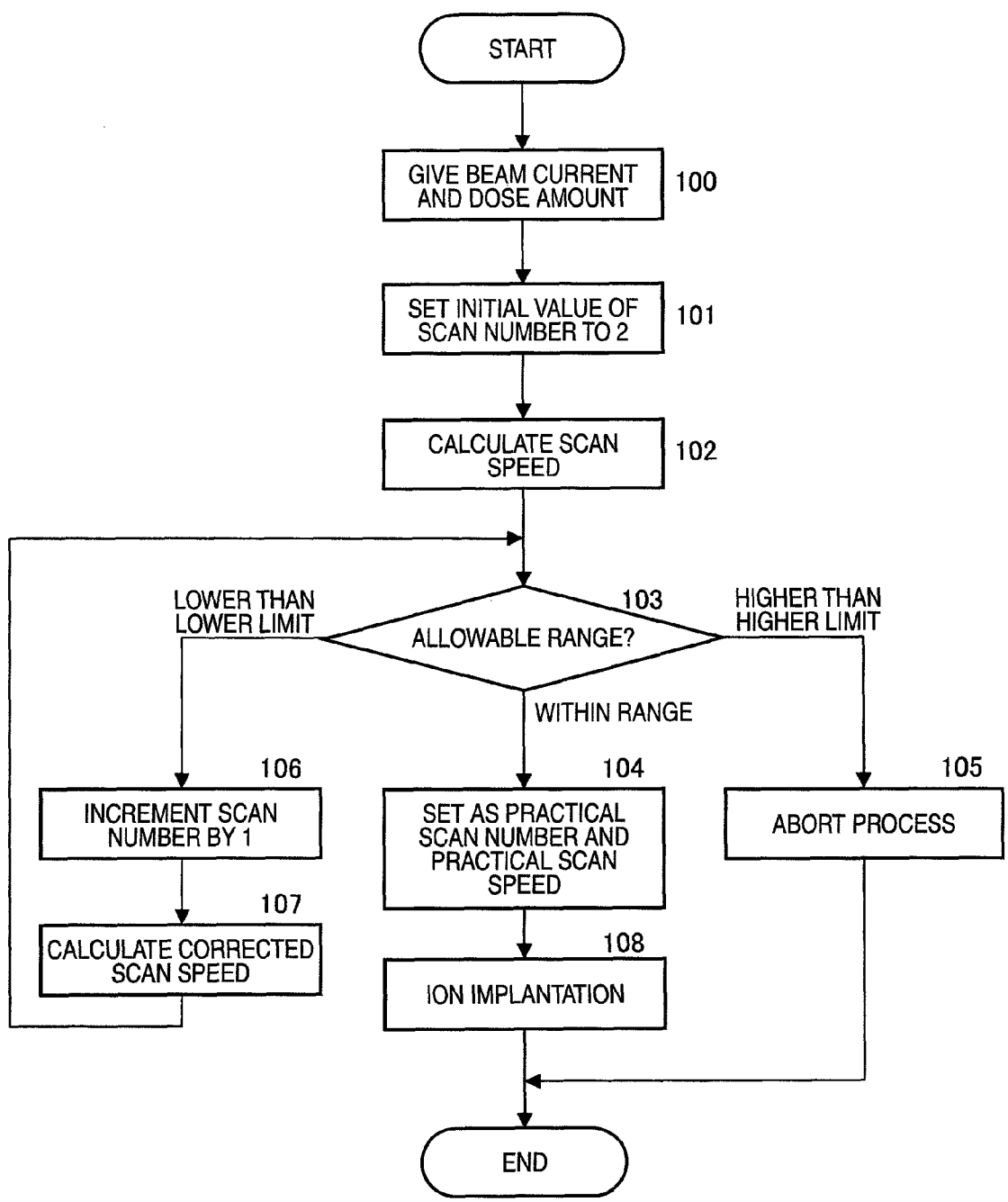
FIG. 4 is a flowchart showing a further embodiment of the ion implantation method of the invention.

In an embodiment shown in FIG. 4, the initial value in step 101 in the flowchart of FIG. 2 is set to 2.

Also in the ion implantation method (apparatus) of the embodiment, as described in the embodiment shown in FIG. 2, under conditions that the scan speed of the substrate 2 is within the predetermined allowable scan speed range, ion implantation can be performed in a scan number which is as small as possible. Therefore, accumulation of time losses which mainly consist of deceleration and acceleration times of the substrate 2 in the vicinities of scan ends can be suppressed, and the throughput can be improved.

Figure 5:
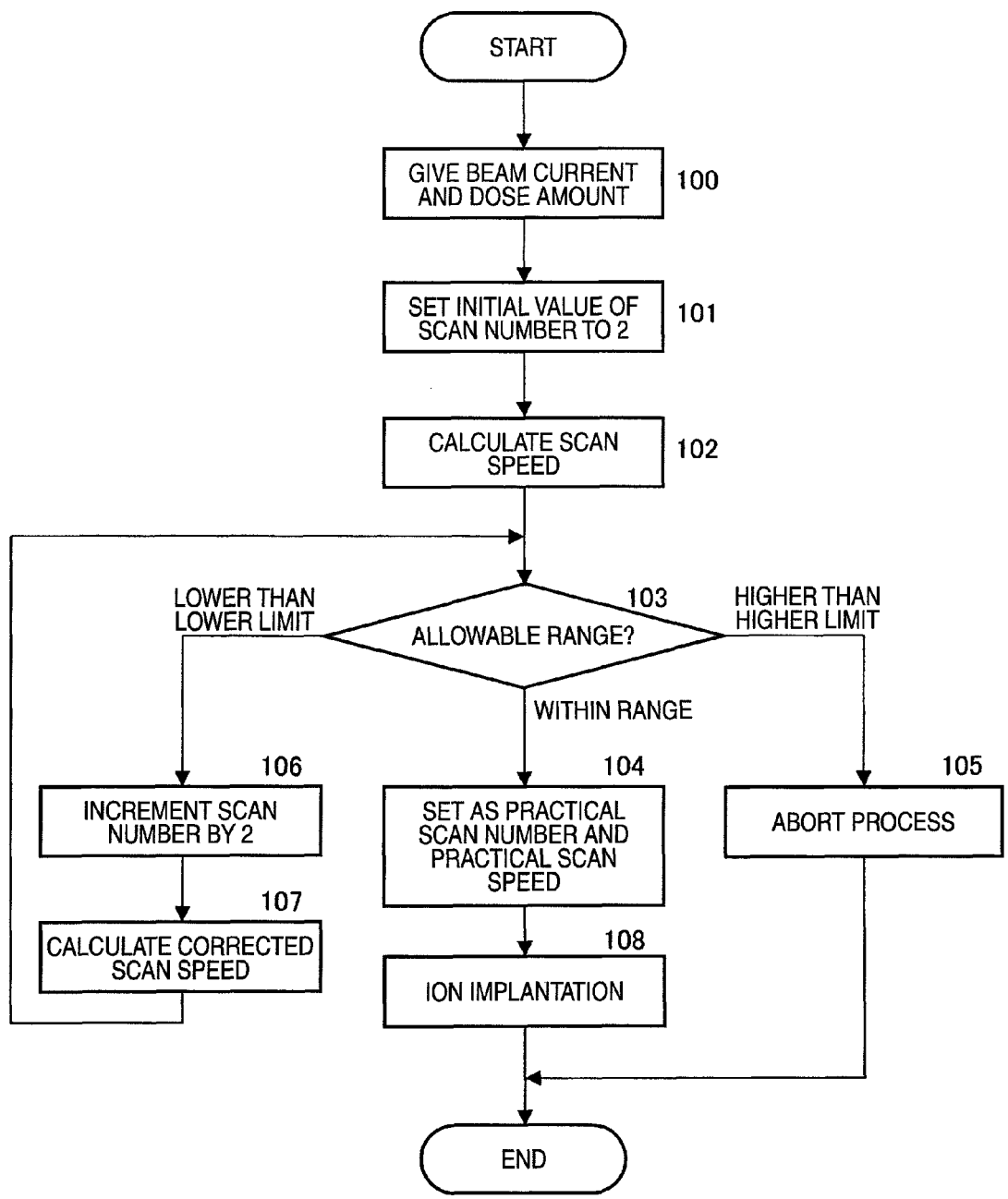
FIG. 5 is a flowchart showing a still further embodiment of the ion implantation method of the invention.

An embodiment shown in FIG. 5 is configured so that, in step 106 of the flowchart of FIG. 4, the corrected scan number is calculated while the scan number is incremented by 2 in place of the increment of one.

Also in the ion implantation method (apparatus) of the embodiment, as described in the embodiment shown in FIG. 4, under conditions that the scan speed of the substrate 2 is within the predetermined allowable scan speed range, ion implantation can be performed in a scan number which is as small as possible. Therefore, accumulation of time losses which mainly consist of deceleration and acceleration times of the substrate 2 in the vicinities of scan ends can be suppressed, and the throughput can be improved.

Moreover, the practical scan number can be surely even-numbered. As described in the embodiment shown in FIG. 3, therefore, a time loss due to the moving time of one extra scan in the case where the scan number is odd can be eliminated, and the throughput can be improved.

Figure 6:
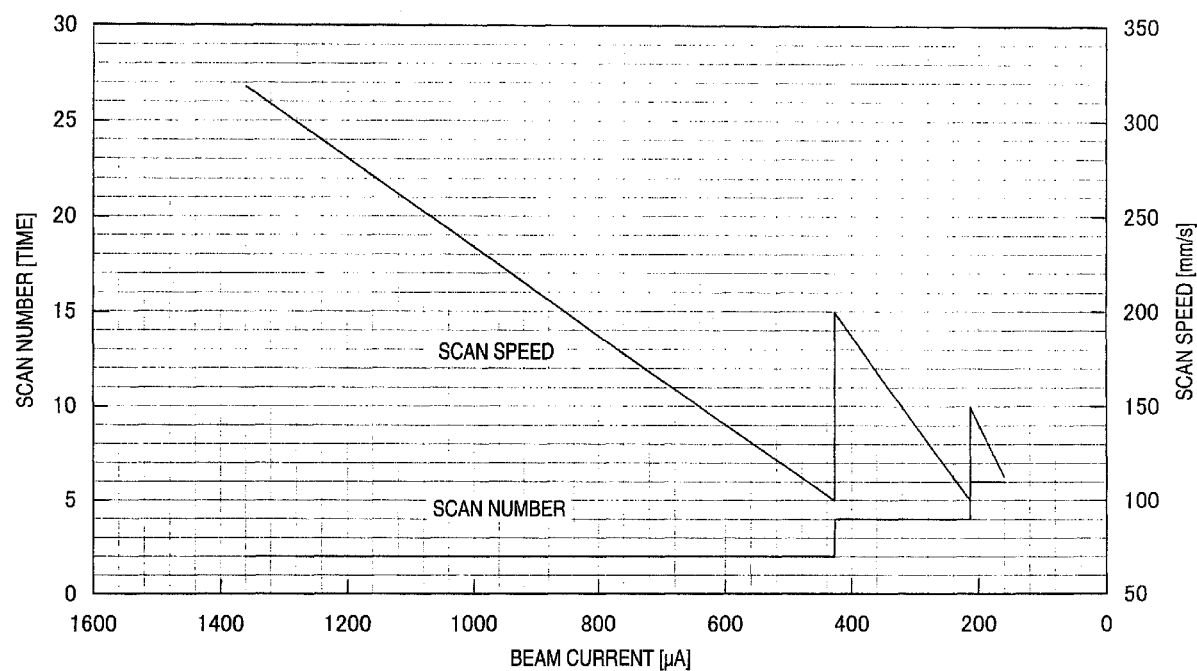
FIG. 6 is a view showing an example of a scan number and scan speed of a substrate in the case where the ion implantation method of the invention is employed.
Figure 12:
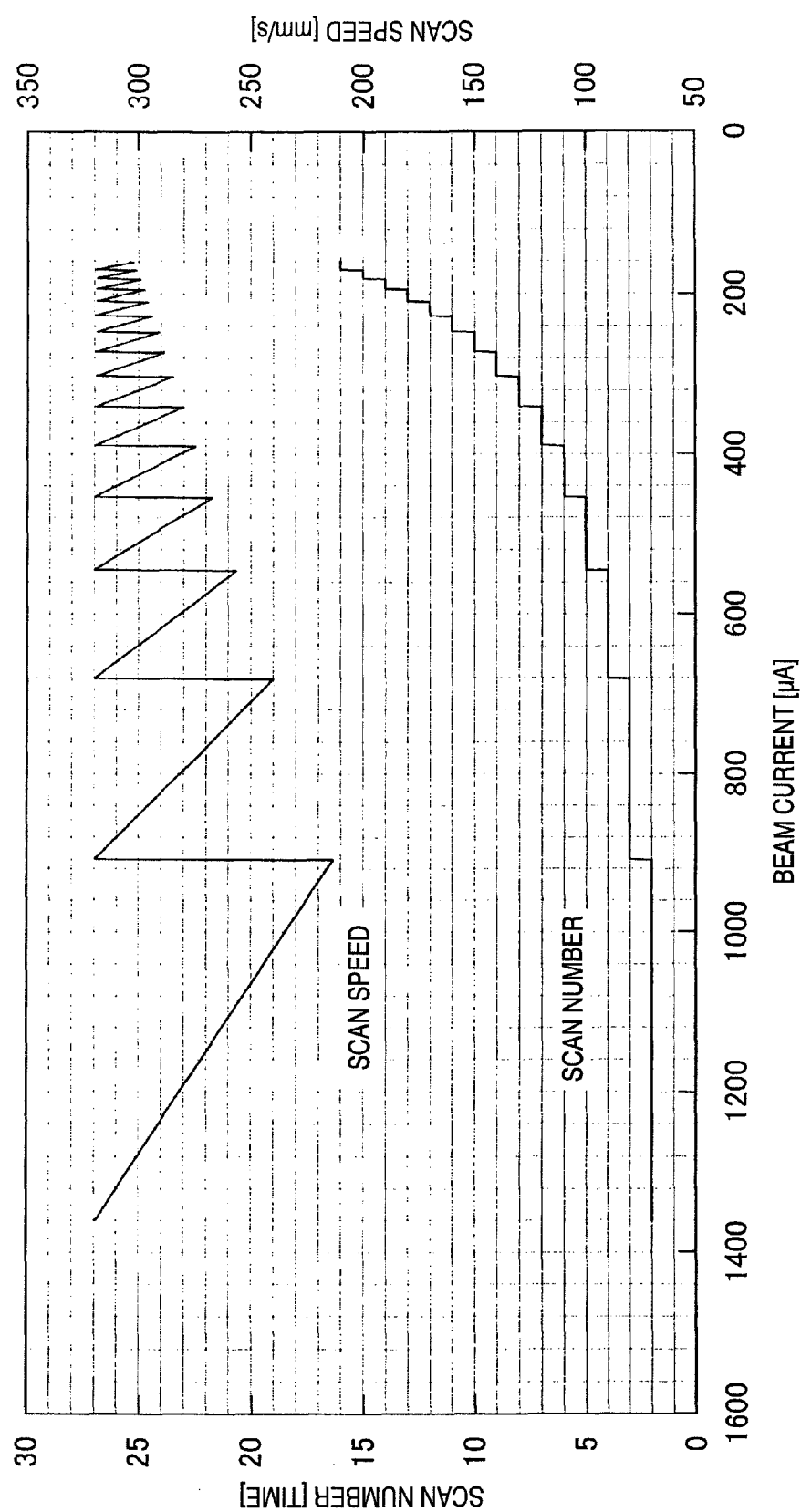
FIG. 12 is a view showing an example of the scan number and scan speed of the substrate in the case where the related-art ion implantation method is employed.
Figure 13:
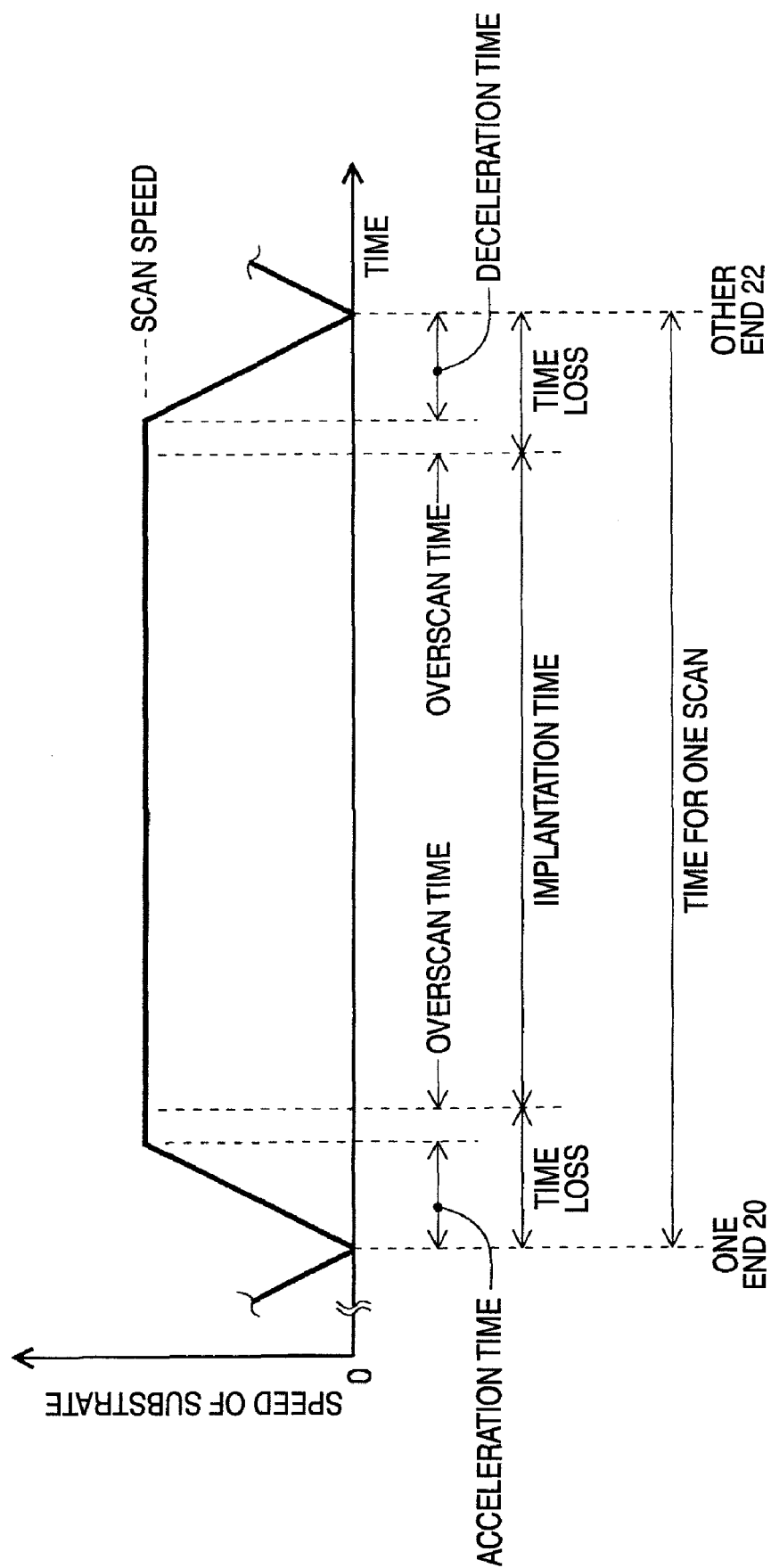
FIG. 13 is a view showing an example of a transition of a speed in one scan of the substrate.

FIG. 6 shows an example of the practical scan number and practical scan speed of the substrate 2 in the case where the ion implantation method (apparatus) of the embodiment shown in FIG. 5 is employed. FIG. 6 is a graph which, in a similar manner as FIG. 12, shows transitions of the practical scan number and the practical scan speed in the case where the dose amount is fixed and the beam current is reduced. The dose amount is equal to that in the case of FIG. 12. The maximum scan speed is equal to the reference scan speed in the case of FIG. 12. In accordance with reduction of the beam current, the scan number is increased. However, it is seen that the increase is suppressed to a very small degree as compared with the case of FIG. 12, and the scan number is always even. Also in the case where the beam current is fixed and the dose amount is increased, a similar tendency is observed, and the scan number is increased while maintained to be even.

Next, an embodiment in which step implantation is performed will be described. In step implantation, ion implantation is performed while, during a period when the ion beam 4 does not impinge on the substrate 2, the substrate 2 is rotated by a step of 360/m deg. about the center portion 2a of the substrate 2 in, for example, the direction of the arrow A (or the opposite direction), and one rotation of the substrate is divided into a plurality (namely, an integer of two or more) m of implanting steps. Namely, m is the implanting step number. The implantation method is also called step rotation implantation. In the embodiment, the twist motor 14 of the substrate driving device 10 is used for the rotation of the substrate 2.

The scan number n per implanting step is an integer of one or more. Therefore, the total scan number N is expressed by the following expression.

$$N = mn \text{ [time]} \qquad \text{[Expression 3]}$$

Figure 7:
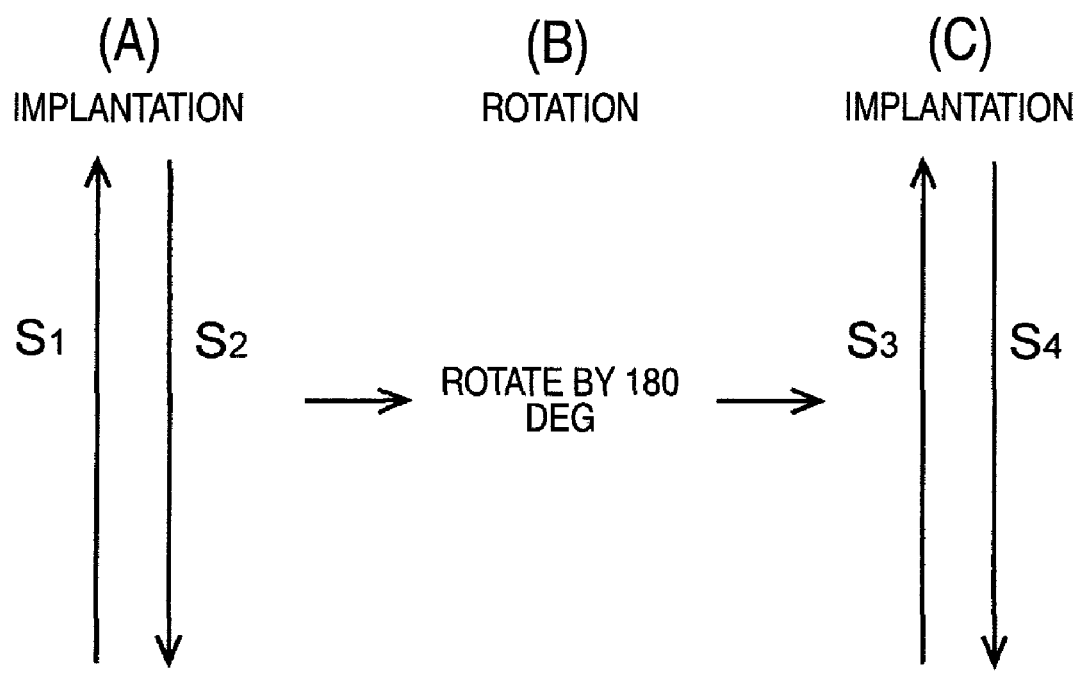
FIG. 7 is a diagram showing an example of step implantation.

FIG. 7 shows an example in the case where the implanting step number m is 2, the scan number n per implanting step is 2, and the total scan number N is 4. In this case, two scans or scans $S_1$ and $S_2$ are performed on the substrate 2 in a first implanting step ((A) of FIG. 7), the substrate 2 is then rotated by 180 (=360/2) deg. ((B) of FIG. 7), and two scans or scans $S_3$ and $S_4$ are then performed on the substrate 2 in a second implanting step ((C) of FIG. 7). In the embodiment, the scans $S_1$ to $S_4$ are performed by using the scanning device 18 of the substrate driving device 10. The detail of this is as described above.

Figure 8:
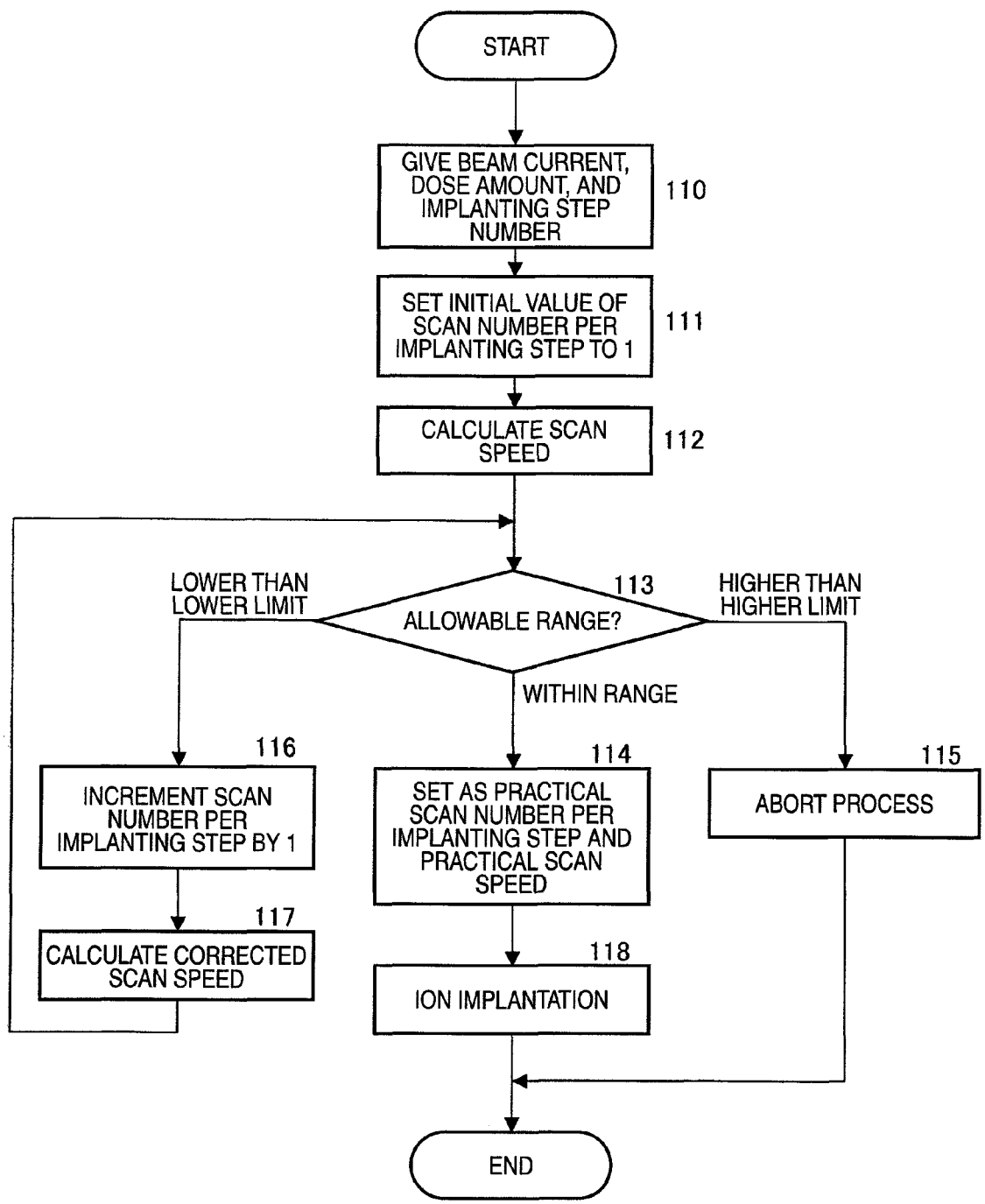
FIG. 8 is a flowchart showing a still further embodiment of the ion implantation method of the invention.

FIG. 8 shows a flowchart in the case where the step implantation is performed. The flowchart will be described while emphasis is placed on differences from FIG. 2.

In the embodiment, the beam current of the ion beam 4, the dose amount to the substrate 2, and the implanting step number are given to the controlling device 30 (step 110). Furthermore, 1 is given as an initial value of the scan number per implanting step (for example, 1 is set, step 111).

In accordance with Expression 4 described below or an expression which is mathematically equivalent thereto, for example, the speed of the scan of the substrate 2 which is performed for realizing the dose amount by the substrate driving device 10 (more specifically, the scanning device 18) is calculated by using these values (step 112). The steps 110 to 112 constitute the scan speed calculating step.

$$\text{scan speed [cm/sec]} = \frac{\text{implanting step number} \times \text{beam current} \times 10^{-6} [C/\text{sec}] \times \text{scan number per implanting step [time]}}{\text{dose amount [ions/cm}^2\text{]} \times \text{elementary electric charge}[C] \times \text{coefficient}} \qquad \text{[Expression 4]}$$

Steps 113, 115 are substantially identical with the steps 103, 105 of FIG. 2, respectively.

If the scan speed is within the allowable scan speed range, the current scan number per implanting step and the current scan speed are set as a practical scan number per implanting step and a practical scan speed, respectively (step 114). If the scan speed is lower than the limit of the allowable scan speed range, the scan number per implanting step is incremented by 1 to calculate the corrected scan number per implanting step (step 116). The steps 113 to 116 constitute the scan speed determining step.

In the case where the corrected scan number per implanting step is calculated, in accordance with Expression 4 described above or an expression which is mathematically equivalent thereto, for example, the corrected scan speed of the substrate 2 for realizing the dose amount is calculated by using the corrected scan number per implanting step, the beam current, and the dose amount (step 117). This step is the corrected-scan speed calculating step.

In the case where the corrected scan speed is calculated, then, the process returns to step 113, and the scan speed determining step is performed on the corrected scan speed to repeat the scan speed determining step and the corrected-scan speed calculating step until the corrected scan speed is within the allowable scan speed range. This step is the repeating step. Therefore, the scan number per implanting step is incremented by a step of 1 from the initial value of 1.

As a result, the practical scan number per implanting step and the practical scan speed are obtained (step 114), and hence ion implantation is performed on the substrate 2 in accordance with the number and the speed (step 118). This step is the ion implanting step.

In the embodiment, the controlling device 30 has a function of performing: a scan speed calculating process which is identical in content to the scan speed calculating step; a scan speed determining process which is identical in content to the scan speed determining step; a corrected-scan speed calculating process which is identical in content to the corrected-scan speed calculating step; a repeating process which is identical in content to the repeating step; and an ion implanting process which is identical in content to the ion implanting step. The controlling device has a further function of performing a control in which the scan speed is in direct proportion to the beam current as described above during ion implantation into the substrate 2.

In the ion implantation method (apparatus) of the embodiment, under conditions that the scan speed of the substrate is within the predetermined allowable scan speed range, ion implantation can be performed in a scan number per implanting step which is as small as possible. Therefore, accumulation of time losses which mainly consist of deceleration and acceleration times of the substrate 2 in the vicinities of scan ends can be suppressed, and the throughput can be improved.

The implanting step number which is given in step 110 may be even-numbered. According to the configuration, the total scan number can be surely even-numbered irrespective of whether the scan number per implanting step is odd or even. As a result, a time loss due to the moving time of the above-described one extra scan in the case where the total scan number is odd can be eliminated. Also from this viewpoint, the throughput can be improved. The detail of the scan process is as described above in the embodiment of FIG. 3.

What is claimed is:

1. An ion implantation method of implanting ions into a substrate using both a ribbon-like ion beam in which, with or without performing an X direction sweep, a dimension in an X direction is larger than a dimension in a Y direction that is orthogonal to the X direction, and a mechanical scan of the substrate in a direction intersecting with a principal face of the ion beam, said method comprising:
   a scan speed calculating step of setting an initial value of a scan number of the substrate to 1, and calculating a scan speed of the substrate by using a beam current of the ion beam, a dose amount to the substrate and the initial value of a scan number of the substrate;
   a scan speed determining step of: determining whether the scan speed of the substrate is within a predetermined allowable scan speed range or not; if the scan speed is within the allowable scan speed range, setting the current scan number and the current scan speed as a practical scan number and a practical scan speed, respectively; if the scan speed is higher than an upper limit of the allowable scan speed range, aborting a process of obtaining the practical scan number and the practical scan speed; and, if the scan speed is lower than a lower limit of the allowable scan speed range, incrementing the scan number by one to calculate a corrected scan number;
   a corrected-scan speed calculating step of, when the corrected scan number is calculated, calculating a corrected scan speed by using the corrected scan number, the beam current, and the dose amount;
   a repeating step of, when the corrected scan speed is calculated, performing a process of said scan speed determining step on the corrected scan speed, and repeating said scan speed determining step and said corrected-scan speed calculating step until the corrected scan speed is within the allowable scan speed range; and
   an ion implanting step of implanting ions into the substrate in accordance with the practical scan number and the practical scan speed.

2. An ion implantation apparatus for implanting ions into a substrate using both a ribbon-like ion beam in which, with or without performing an X direction sweep, a dimension in an X direction is larger than a dimension in a Y direction that is orthogonal to the X direction, and a mechanical scan of the substrate in a direction intersecting with a principal face of the ion beam, said apparatus comprising:
   a controlling device having a function of performing: (a) a scan speed calculating process of setting an initial value of a scan number of the substrate to 1, and calculating a scan speed of the substrate by using a beam current of the ion beam, and a dose amount to the substrate, and the initial value of a scan number of the substrate; (b) a scan speed determining process of: determining whether the scan speed of the substrate is within a predetermined allowable scan speed range or not; if the scan speed is within the allowable scan speed range, setting the current scan number and the current scan speed as a practical scan number and a practical scan speed, respectively; if the scan speed is higher than an upper limit of the allowable scan speed range, aborting a process of obtaining the practical scan number and the practical scan speed; and, if the scan speed is lower than a lower limit of the allowable scan speed range, incrementing the scan number by one to calculate a corrected scan number; (c) a corrected-scan speed calculating process of, when the corrected scan number is calculated, calculating a corrected scan speed by using the corrected scan number, the beam current, and the dose amount; (d) a repeating process of, when the corrected scan speed is calculated, performing a process of said scan speed determining step on the corrected scan speed, and repeating said scan speed determining step and said corrected-scan speed calculating step until the corrected scan speed is within the allowable scan speed range; and (e) an ion implanting process of implanting ions into the substrate in accordance with the practical scan number and the practical scan speed.

3. An ion implantation method according to claim 1,
   wherein the scan speed determining step includes a scan number determining step of, if the scan speed is within the allowable scan speed range, determining whether the current scan number is even or odd; if the current scan number is even, setting the current scan number and the current scan speed as the practical scan number and the practical scan speed, respectively; and, if the current scan number is odd, incrementing the scan number by one to calculate a corrected scan number, and
   wherein the repeating step repeats said scan speed determining step and said corrected-scan speed calculating step until the corrected scan speed is within the allowable scan speed range and the corrected scan number becomes even.

4. An ion implantation apparatus according to claim 2,
   wherein the function of performing (b) the scan speed determining process includes a scan number determining process of, if the scan speed is within the allowable scan speed range, determining whether the current scan number is even or odd; if the current scan number is even, setting the current scan number and the current scan speed as the practical scan number and the practical scan speed, respectively; and, if the current scan number is odd, incrementing the scan number by one to calculate a corrected scan number, and wherein the function of performing (d) the repeating process repeats said scan speed determining step and said corrected-scan speed calculating step until the corrected scan speed is within the allowable scan speed range and the corrected scan number becomes even.

5. An ion implantation method according to claim 1, wherein, in said scan speed calculating step, the initial value of the scan number of the substrate is set to 2 in place of 1.

6. An ion implantation apparatus according to claim 2, wherein, in said scan speed calculating process of said controlling device, the initial value of the scan number of the substrate is set to 2 in place of 1.

7. An ion implantation method according to claim 1, wherein, in said scan speed calculating step, the initial value of the scan number of the substrate is set to 2 in place of 1, and, in said scan speed determining step, the scan number is incremented by 2 in place of one to calculate the corrected scan number.

8. An ion implantation apparatus according to claim 2, wherein, in said scan speed calculating process of said controlling device, the initial value of the scan number of the substrate is set to 2 in place of 1, and, in said scan speed determining process, the scan number is incremented by 2 in place of one to calculate the corrected scan number.

9. An ion implantation method of implanting ions into a substrate using both a ribbon-like ion beam in which, with or without performing an X direction sweep, a dimension in an X direction is larger than a dimension in a Y direction that is orthogonal to the X direction, a mechanical scan of the substrate in a direction intersecting with a principal face of the ion beam, and performance of ion implantation while, during a period when the ion beam does not impinge on the substrate, rotating the substrate by a step of 360/m deg. about a center portion of the substrate, and dividing one rotation of the substrate into a plurality m of implanting steps, said method comprising:
   a scan speed calculating step of setting an initial value of a scan number of the substrate per implanting step to 1, and calculating a scan speed of the substrate by using a beam current of the ion beam, a dose amount to the substrate, a implanting step number, and the initial value of the scan number of the substrate, and;
   a scan speed determining step of: determining whether the scan speed of the substrate is within a predetermined allowable scan speed range or not; if the scan speed is within the allowable scan speed range, setting the current scan number per implanting step, and the current scan speed as a practical scan number per implanting step, and a practical scan speed, respectively; if the scan speed is higher than an upper limit of the allowable scan speed range, aborting a process of obtaining the practical scan number per implanting step, and the practical scan speed; and, if the scan speed is lower than a lower limit of the allowable scan speed range, incrementing the scan number per implanting step by one to calculate a corrected scan number per implanting step;
   a corrected-scan speed calculating step of, when the corrected scan number per implanting step is calculated, calculating a corrected scan speed by using the corrected scan number per implanting step, the beam current, the dose amount, and the implanting step number;
   a repeating step of, when the corrected scan speed is calculated, performing a process of said scan speed determining step on the corrected scan speed, and repeating said scan speed determining step and said corrected-scan speed calculating step until the corrected scan speed is within the allowable scan speed range; and
   an ion implanting step of implanting ions into the substrate in accordance with the practical scan number per implanting step and the practical scan speed.

10. An ion implantation apparatus for implanting ions into a substrate using both a ribbon-like ion beam in which, with or without performing an X direction sweep, a dimension in an X direction is larger than a dimension in a Y direction that is orthogonal to the X direction, a mechanical scan of the substrate in a direction intersecting with a principal face of the ion beam, and performance of ion implantation while, during a period when the ion beam does not impinge on the substrate, rotating the substrate by a step of 360/m deg. about a center portion of the substrate, and dividing one rotation of the substrate into a plurality m of implanting steps, said apparatus comprising:
   a controlling device having a function of performing: (a) a scan speed calculating process of setting an initial value of a scan number of the substrate per implanting step to 1, and calculating a scan speed of the substrate by using a beam current of the ion beam, a dose amount to the substrate, a implanting step number and the initial value of the scan number of the substrate per implanting step; (b) a scan speed determining process of: determining whether the scan speed of the substrate is within a predetermined allowable scan speed range or not; if the scan speed is within the allowable scan speed range, setting the current scan number per implanting step, and the current scan speed as a practical scan number per implanting step, and a practical scan speed, respectively; if the scan speed is higher than an upper limit of the allowable scan speed range, aborting a process of obtaining the practical scan number per implanting step, and the practical scan speed; and, if the scan speed is lower than a lower limit of the allowable scan speed range, incrementing the scan number per implanting step by one to calculate a corrected scan number per implanting step; (c) a corrected-scan speed calculating process of, when the corrected scan number per implanting step is calculated, calculating a corrected scan speed, by using the corrected scan number per implanting step, the beam current, the dose amount, and the implanting step number; (d) a repeating process of, when the corrected scan speed is calculated, performing a process of said scan speed determining step on the corrected scan speed, and repeating said scan speed determining step and said corrected-scan speed calculating step until the corrected scan speed is within the allowable scan speed range; and (e) an ion implanting process of implanting ions into the substrate in accordance with the practical scan number per implanting step and the practical scan speed.

11. An ion implantation method according to claim 9, wherein the implanting step number is even.

12. An ion implantation apparatus according to claim 10, wherein the implanting step number is even.

* * * * *